US012633366B2

(12) United States Patent
Yun

(10) Patent No.: US 12,633,366 B2
(45) Date of Patent: May 19, 2026

(54) SWITCHED-CAPACITOR CIRCUIT WITH REDUCED THERMAL NOISE

(71) Applicant: Board of Regents, The University of Texas System, Austin, TX (US)

(72) Inventor: Chiu Yun, Frisco, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 18/760,517

(22) Filed: Jul. 1, 2024

(65) Prior Publication Data

US 2026/0005605 A1     Jan. 1, 2026

(51) Int. Cl.
*G11C 27/02* (2006.01)
*H03M 1/12* (2006.01)

(52) U.S. Cl.
CPC ......... *G11C 27/024* (2013.01); *H03M 1/1245* (2013.01)

(58) Field of Classification Search
None
See application file for complete search history.

(56) References Cited

U.S. PATENT DOCUMENTS

| | | | | |
|---|---|---|---|---|
| 5,028,893 A * | 7/1991 | Marrah | ................ | H03H 19/004 |
| | | | | 333/81 R |
| 8,508,257 B2 * | 8/2013 | Kapusta | .................. | G11C 7/02 |
| | | | | 327/96 |
| 9,762,218 B2 * | 9/2017 | Matsuno | ............. | H03F 3/45183 |
| 10,756,685 B2 * | 8/2020 | Vasan | ..................... | H03F 3/393 |
| 2020/0091880 A1 * | 3/2020 | Fan | ........................... | H03F 3/38 |

* cited by examiner

*Primary Examiner* — Thomas J. Hiltunen
(74) *Attorney, Agent, or Firm* — Yee & Associates, P.C.

(57) ABSTRACT

A switched-capacitor circuit includes a sample and hold stage including an input coupled to a circuit input and including an output. The circuit includes an amplification stage including an input coupled to the output of the sample and hold stage and including an output. The circuit includes an output stage including an input coupled to the output of the amplification stage and an output coupled to the circuit output. The circuit includes a feedback stage including a first terminal coupled to the circuit output, a second terminal coupled to the input of the amplification stage and including a third terminal.

21 Claims, 6 Drawing Sheets

SWITCHED-CAPACITOR CIRCUIT WITH REDUCED THERMAL NOISE

BACKGROUND INFORMATION

1. Technical Field

This description relates generally to switched-capacitor circuits, and more particularly to a switched-capacitor circuit with reduced thermal noise.

2. Background

Switched-capacitor circuits are widely used in mixed signal applications. During a sampling phase, a switch is closed to couple a sampling capacitor to an input signal, thereby charging the sampling capacitor. The sampled charge on the capacitor is transferred or distributed to other components such as data converters, gain stages, and buffers.

In switched-capacitor circuits, transistors (e.g., CMOS transistors) are generally used as switches. When a voltage is applied to a gate of a transistor, the transistor is turned ON, which causes the transistor to conduct, and in this state the switch is considered closed. When the voltage is removed from the gate, the transistor is turned OFF, which causes the transistor to cease to conduct, and in this state the switch is considered opened.

One drawback of a switched-capacitor circuit is the presence of thermal noise (also called Johnson noise or Nyquist noise). Thermal noise arises due to random motion of electrons in resistive elements such as, for example, "on resistance" ($R_{ON}$) of transistors and other resistors. When a signal is sampled, thermal noise is also sampled and is distributed to other components in the circuit. Thermal noise is a major limitation on the performance of switched-capacitor circuits and degrades the signal-to-noise ratio (SNR) of the circuits.

Thermal noise power is expressed as kT/C, where k is the Boltzmann constant, T is the absolute temperature, and C is the sampling capacitance. To reduce thermal noise in a circuit, larger capacitance must be used. However, if capacitance is increased, other performance parameters in the circuit are affected. For example, increasing capacitance requires larger die area in an integrated circuit and causes higher power consumption in an amplifier that drives the sampling capacitor.

SUMMARY

Illustrative embodiments provide a switched-capacitor circuit which includes a circuit input and a circuit output. The circuit includes a sample and hold stage which includes an input coupled to the circuit input and includes an output. The circuit includes an amplification stage which includes an input coupled to the output of the sample and hold stage and includes an output. The circuit includes an output stage which includes an input coupled to the output of the amplification stage and an output coupled to the circuit output. The circuit includes a feedback stage which includes a first terminal coupled to the circuit output, a second terminal coupled to the input of the amplification stage and includes a third terminal. The circuit includes a first noise cancellation stage which includes differential inputs coupled to the sample/hold stage and an output coupled to the output of the amplification stage. The circuit includes a second noise cancellation stage which includes a first terminal coupled to the third terminal of the feedback stage and a second terminal coupled to the output of the amplification stage.

In an illustrative embodiment, the sample and hold stage includes a first switch including a first terminal coupled to the circuit input and including a second terminal. The sample and hold stage includes a second switch including a first terminal coupled to the second terminal of the first switch and a second terminal coupled to a reference potential. The sample and hold stage includes a first sampling capacitor including a first terminal coupled to the second terminal of the first switch and including a second terminal. The sample and hold stage includes a third switch including a first terminal coupled to the second terminal of the first sampling capacitor and a second terminal coupled to the reference potential.

In an illustrative embodiment, the amplification stage includes a first operational amplifier including a non-inverting input coupled to the second terminal of the first sampling capacitor, an inverting input coupled to the reference potential and including an output. The amplification stage includes a second sampling capacitor including a first terminal coupled to the output of the first operational amplifier and including an output. The amplification stage includes a fourth switch including a first terminal coupled to the second terminal of the second sampling capacitor and a second terminal coupled to the reference potential.

In an illustrative embodiment, the first noise cancellation stage includes a second operational amplifier including a non-inverting input coupled to the first terminal of the first switch, an inverting input coupled to the second terminal of the first switch, and an output coupled to the output of the first operational amplifier.

In an illustrative embodiment, the feedback stage includes a feedback capacitor including a first terminal coupled to the non-inverting input of the first operational amplifier and including a second terminal. The feedback stage includes a fifth switch including a first terminal coupled to the circuit output and a second terminal coupled to the second terminal of the feedback capacitor. The feedback stage includes a sixth switch including a first terminal coupled to the second terminal of the feedback capacitor and a second terminal coupled to the reference potential.

In an illustrative embodiment, the output stage includes a third operational amplifier including an inverting input coupled to the second terminal of the second sampling capacitor, a non-inverting input coupled to the reference potential and an output coupled to the circuit output.

In an illustrative embodiment, the second noise cancellation stage includes a fourth operational amplifier including a non-inverting input coupled to the second terminal of the feedback capacitor, an inverting input coupled to the reference potential and an output coupled to the output of the first operational amplifier.

In an illustrative embodiment, a switched-capacitor circuit includes a circuit input and a circuit output. The circuit includes a first switch including a first terminal coupled to the circuit input and including a second terminal. The circuit includes a second switch including a first terminal coupled to the second terminal of the first switch and including a second terminal coupled to a reference potential. The circuit includes a first sampling capacitor including a first terminal coupled to the second terminal of the first switch and including a second terminal. The circuit includes a third switch including a first terminal coupled to the second terminal of the sampling capacitor and a second terminal coupled to the reference potential. The circuit includes a first operational amplifier including a non-inverting input coupled to the second terminal of the first sampling capacitor, an inverting input coupled to the reference potential and including an output. The circuit includes a second sampling capacitor including a first terminal coupled to the output of the first operational amplifier and including an output. The circuit includes a fourth switch including a first terminal coupled to the second terminal of the second sampling capacitor and a second terminal coupled to the reference potential. The circuit includes a second operational amplifier including a non-inverting input coupled to the first terminal of the first switch, an inverting input coupled to the second terminal of the first switch, and an output coupled to the output of the first operational amplifier. The circuit includes a third operational amplifier including an inverting input coupled to the second terminal of the second sampling capacitor, a non-inverting input coupled to the reference potential and an output coupled to the circuit output. The circuit includes a feedback circuit including a first terminal coupled the circuit output and a second terminal coupled to the non-inverting input of the first operational amplifier.

BRIEF DESCRIPTION OF THE DRAWINGS

The same reference numerals or other feature designators are used in the drawings to designate the same or similar (functionally and/or structurally) features.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 1:
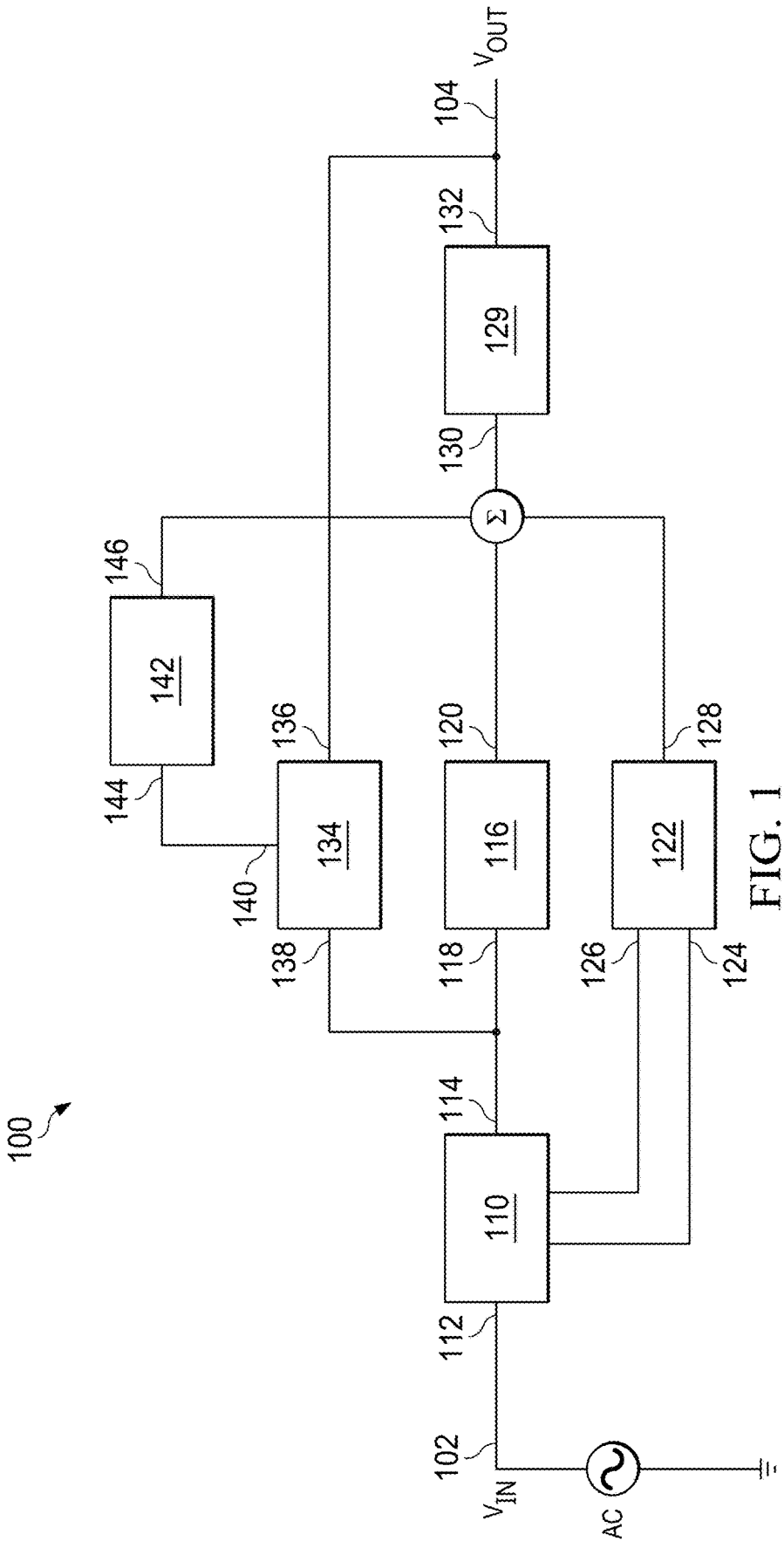
FIG. 1 is a block diagram illustrating a switched-capacitor circuit in accordance with an illustrative embodiment.

FIG. 1 is a block diagram illustrating switched-capacitor circuit 100 in accordance with an illustrative embodiment. Switched-capacitor circuit 100 addresses the limitations of existing circuits by reducing thermal noise.

Switched-capacitor circuit 100 includes circuit input 102 and circuit output 104. Circuit 100 includes sample/hold stage 110 which has input 112 coupled to circuit input 102 and has output 114. Sample/hold stage 110 is configured to store and hold a sampled voltage or charge proportional to input signal $V_{IN}$ during a sampling phase of circuit 100. The sampled voltage or charge is held until it is processed by subsequent circuitry. Sample/hold stage 110 is described in more detail with references to FIGS. 2, 3 and 4.

Circuit 100 includes amplification stage 116 which has input 118 coupled to output 114 of sample/hold stage 110 and has output 120. Amplification stage 116 is described in more detail with references to FIGS. 2, 3 and 4.

Circuit 100 includes first noise cancellation stage 122 which has differential inputs 124 and 126 coupled to sample/hold stage 110 and has output 128 coupled to output 120 of amplification stage 116. First noise cancellation stage 122 is configured to cancel at least a part of the thermal noise in circuit 100. First noise cancellation stage 122 is described in more detail with references to FIGS. 2, 3 and 4.

Circuit 100 includes output stage 129 which has input 130 coupled to output 120 of amplification stage 116. Output stage 129 has output 132 coupled to circuit output 104. The primary function of output stage 129 is to perform signal amplification and filtering necessary for accurate sampling and conversion of the input signal. Output stage 129 also acts as a buffer, presenting a high input impedance to the input signal to minimize loading effects and maintain signal integrity. Output stage 129 is described in more detail with references to FIGS. 2, 3 and 4.

Circuit 100 includes feedback stage 134 which has first terminal 136 coupled to circuit output 104, second terminal 138 coupled to input 118 of amplification stage 116 and includes third terminal 140. One of the primary functions of feedback stage 134 is to maintain the stability and linearity of circuit 100. Feedback stage 134 allows control of the gain of circuit 100. The gain control is necessary for matching the output of circuit 100 to the requirements of subsequent circuits. Feedback stage 134 establishes a feedback path to ensure any error at output 132 of output stage 128 is fed back to its input. Feedback stage 134 is described in further detail with reference to FIGS. 2, 3 and 4.

Circuit 100 includes second noise cancellation stage 142 which has first terminal 144 coupled to third terminal 140 of feedback stage 134 and second terminal 146 coupled to output 120 of amplification stage 116. Second noise cancellation stage 142 is configured to cancel at least a part of the thermal noise in circuit 100. Second noise cancellation stage 142 is described in more detail with references to FIGS. 2, 3 and 4.

Figure 2:
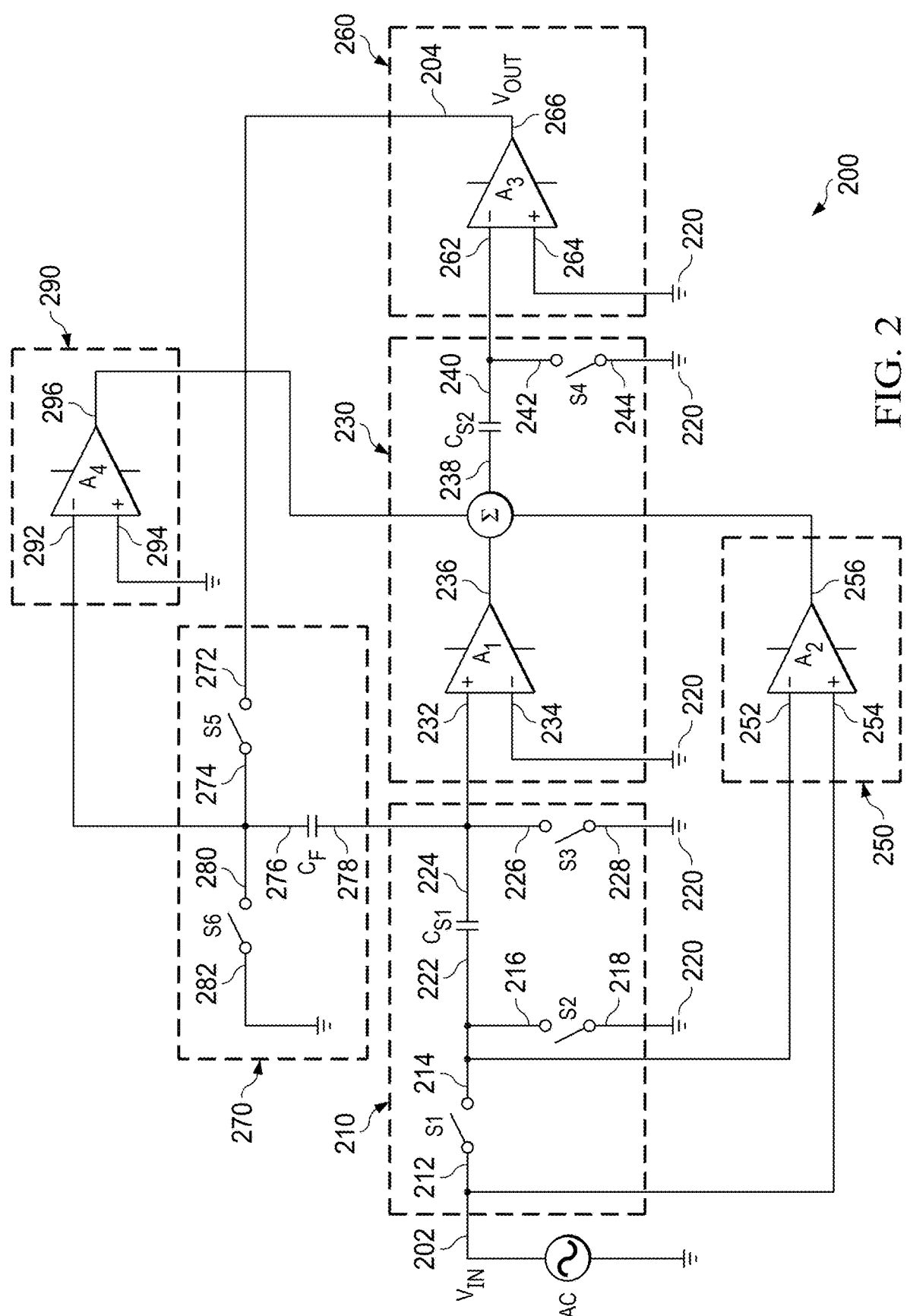
FIG. 2 is a schematic diagram illustrating a switched-capacitor circuit in accordance with an illustrative embodiment.

FIG. 2 is a schematic diagram illustrating switched-capacitor circuit 200 in accordance with an illustrative embodiment. Switched-capacitor circuit 200 includes circuit input 202 and circuit output 204. Circuit 200 includes sample/hold stage 210. Sample/hold stage 210 includes first switch S1, second switch S2, third switch S3 and sampling capacitor $C_{S1}$. First switch S1 has first terminal 212 coupled to circuit input 202 and has second terminal 214. Second switch S2 has first terminal 216 coupled to second terminal 214 of first switch S1 and has second terminal 218 coupled to reference potential 220 (e.g., ground). Sampling capacitor $C_{S1}$ (e.g., 1 to 10 pF) has first terminal 222 coupled to second terminal 214 of switch S1 and has second terminal 224. Third switch S3 has first terminal 226 coupled to second terminal 224 of $C_{S1}$ and second terminal 228 coupled to reference potential 220 (e.g., ground).

Switched-capacitor circuit 200 includes amplification stage 230 which includes first operational amplifier $A_1$, capacitor $C_{S2}$ (e.g., 10 pF to 100 pF) and fourth switch S4. Amplifier $A_1$ has non-inverting input 232 coupled to second terminal 224 of capacitor $C_{S1}$ and inverting input 234 coupled to reference potential 220 (e.g., ground). Amplifier A1 has output 236. Capacitor $C_{S2}$ has first terminal 238 coupled to output 236 of amplifier A1 and has second terminal 240. Fourth switch S4 has first terminal 242 coupled to second terminal 240 of capacitor $C_{S2}$ and second terminal 244 coupled to reference potential 220.

Switched-capacitor circuit 200 includes first noise cancellation stage 250 which includes second operational amplifier $A_2$. Amplifier $A_2$ has inverting input 252 coupled to second terminal 214 of switch S1 and has non-inverting input 254 coupled to first terminal 212 of switch S1. Amplifier $A_2$ has output 256 coupled to output 236 of amplifier $A_1$. Amplifier $A_1$ is differentially coupled to switch S1 and receives a differential input signal from switch S1.

Switched-capacitor circuit 200 includes output stage 260 which includes third operational amplifier $A_3$. Amplifier $A_3$ has inverting input 262 coupled to second terminal 240 of $C_{S2}$, non-inverting input 264 coupled to reference potential 220 and output 266 coupled to circuit output 204.

Switched-capacitor circuit 200 includes feedback stage 270 which includes fifth switch S5, sixth switch S6 and feedback capacitor $C_F$. (e.g., 0.1 pF to 1 pF). Fifth switch S5 has first terminal 272 coupled to circuit output 204 and has second terminal 274. Feedback capacitor $C_F$ has first terminal 276 coupled to second terminal 274 of switch S5 and second terminal 278 coupled to non-inverting input 232 of amplifier $A_2$. Sixth switch S6 has first terminal 280 coupled to first terminal 276 of capacitor $C_F$ and second terminal 282 coupled to reference potential 220.

Switched-capacitor circuit 200 includes second noise cancellation stage 290 which includes fourth operational amplifier $A_4$. Amplifier $A_4$ has inverting input 292 coupled to first terminal 280 of switch S6 and has non-inverting input 294 coupled to reference potential 220. Amplifier $A_4$ has output 296 coupled to output 236 of amplifier $A_1$.

Figure 3:
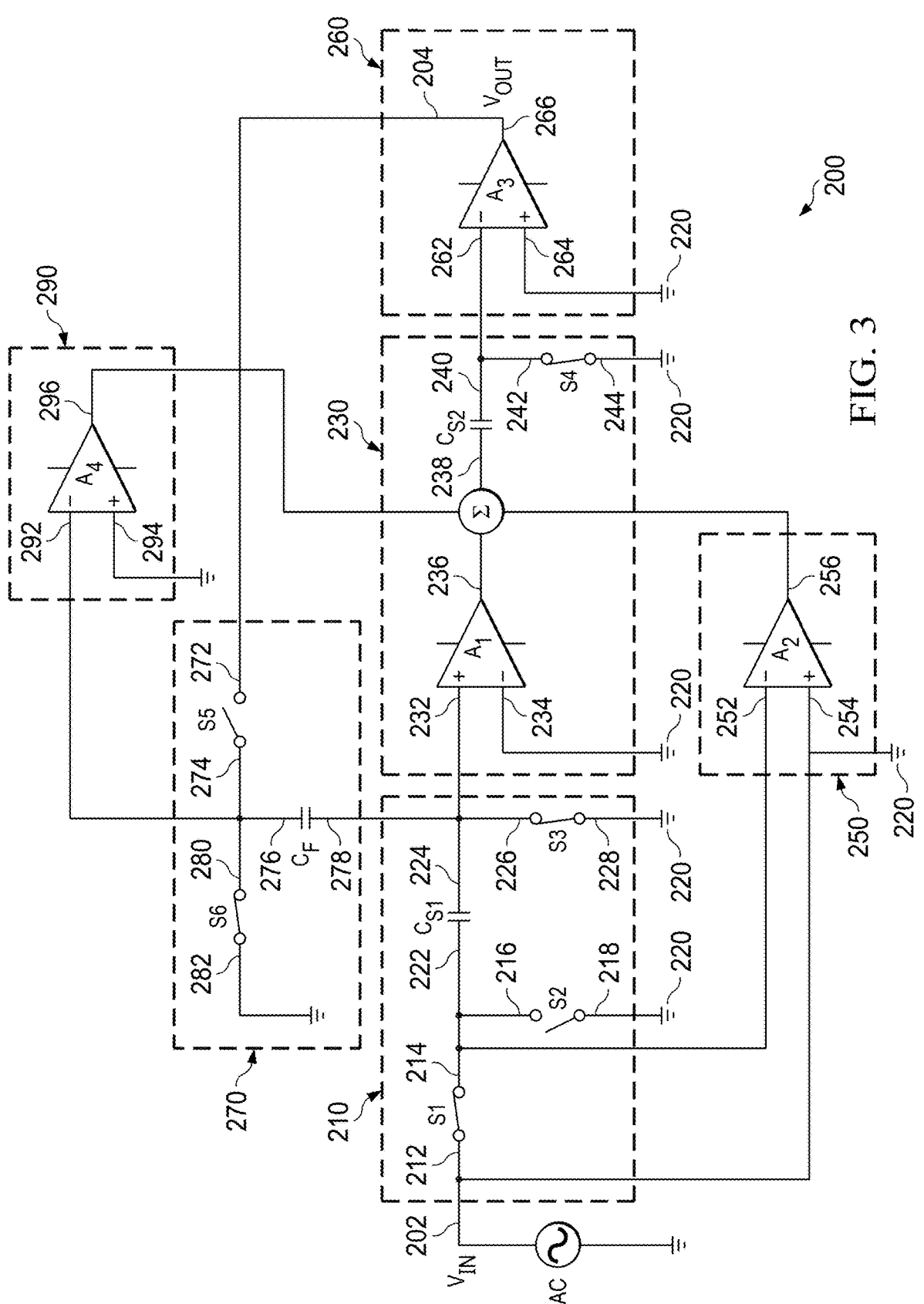
FIG. 3 illustrates the switched-capacitor circuit of FIG. 2 during a first phase.
Figure 4:
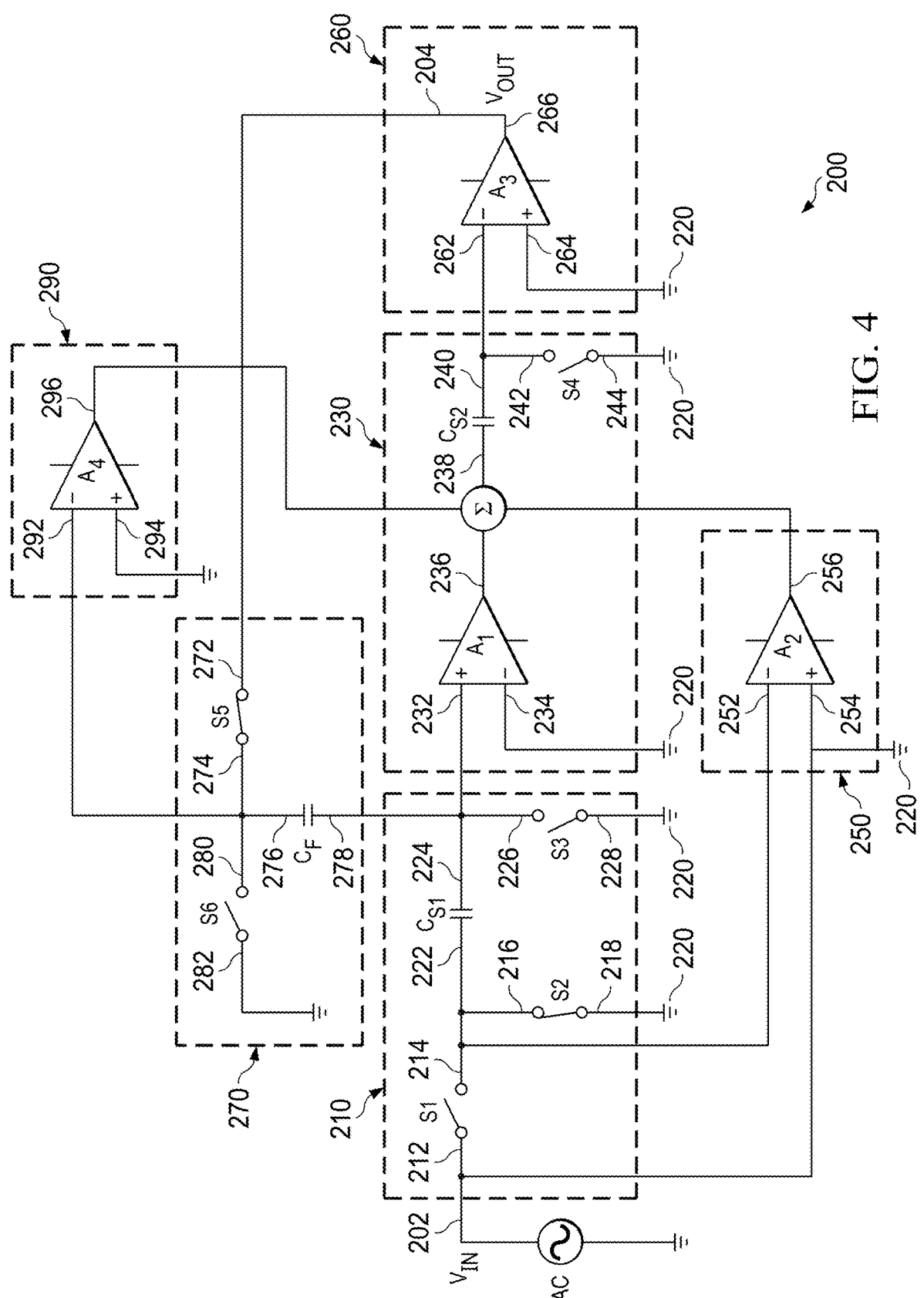
FIG. 4 illustrates the switched-capacitor circuit of FIG. 2 during a second phase.

The operation of switched-capacitor circuit 200 is described with references to FIGS. 2, 3 and 4. In the illustrative embodiments, switches S1-S6 are implemented with transistors (e.g., MOSFETs). Circuit 200 is operated in a first phase (e.g., sample/hold phase) and in a second phase (e.g., transfer phase).

FIG. 3 illustrates switched-capacitor circuit 200 during the first phase (e.g., sample/hold stage). In this phase, switches S1, S3, S4 and S6 are turned ON (close) and switches S2 and S5 are turned OFF (open). Thus, capacitor $C_{S1}$ is coupled to receive input signal $V_{IN}$, capacitor $C_F$ is coupled to reference potential 220, capacitor $C_{S2}$ is coupled to reference potential, and feedback stage 270 is disabled. Because the non-inverting and inverting inputs of $A_1$ are coupled to ground, amplifier $A_1$ remains idle. Similarly, because the non-inverting and inverting inputs of $A_3$ are coupled to ground and feedback stage 270 is disabled, amplifier $A_3$ remains idle. Also, because the inverting and non-inverting inputs of amplifier $A_4$ are coupled to ground, amplifier $A_4$ remains idle. Because capacitor $C_{S1}$ is coupled to input signal $V_{IN}$, and capacitor $C_F$ is coupled to capacitor $C_{S1}$, $C_{S1}$ and $C_F$ are charged to a voltage level proportional to $V_{IN}$.

When the switches are ON (i.e., closed), an "on resistance" ($R_{ON}$) is present between sources and drains of the transistors used in implementation of the switches. As a result, thermal noise arises due to random motion of electrons through "on resistance" of the transistors. Thus, when switch S1 is closed, S1 contributes to thermal noise which charges capacitors $C_{S1}$ and $C_F$. When the charges in $C_{S1}$ and $C_F$ are subsequently transferred to other components, the thermal noise is also transferred. Thermal noise is a major limitation on the performance of switched-capacitor circuits and degrades the signal-to-noise ratio (SNR) of the circuits.

FIG. 4 illustrates switched-capacitor circuit 200 during the second phase (e.g., transfer phase). In this phase, switches S1, S3, S4 and S6 are turned OFF (open) and switches S2 and S5 are turned ON (close). Thus, feedback stage 270 is activated, inverting input 262 of amplifier $A_3$ coupled to second terminal 240 of capacitor $C_{S2}$, and non-inverting input 232 of amplifier $A_1$ is coupled to capacitors $C_{S1}$ and $C_F$. As a result, amplifiers $A_1$ and $A_3$ operate in a closed-loop configuration. Due to a high input resistance presented by $A_1$, the charges in capacitor $C_{S1}$ will be transferred to $C_F$, and as a result, output signal $V_{OUT}$ appears at circuit output 204.

In the second phase, thermal noise $V_{N1}$ caused by the switches S1 and S6 during the first phase is sampled on capacitor $C_{S2}$. However, amplifier $A_2$ receives a differential input signal from switch S1 and produces an output signal which is coupled to output 236 of amplifier $A_1$. The output signal from amplifier $A_2$ has the same amplitude but an inverse phase of the thermal noise contribution from switch S1. This matched signal with an inverted gain cancels the thermal noise caused by the switch S1. In some example embodiments, the gain of amplifiers $A_1$ and $A_2$ are independently optimized without limiting the overall performance of circuit 200. As explained further with reference to FIG. 5, switches S1 and S6 are held ON (e.g., close) for an additional period TX. During this period, capacitor $C_{S2}$ is charged by noise signals from switches S1 and S6 charge $C_{S2}$. This noise is cancelled due to operations by amplifier $A_2$ and $A_4$ during the period TX. Existing circuits and methods have drawbacks because the noise signal which charges capacitor $C_{S2}$ during the period TX is not cancelled. The illustrative embodiments significantly reduce thermal noise by utilizing amplifiers $A_2$ and $A_4$.

Likewise, amplifier $A_4$ produces an output signal which is also coupled to output 236 of amplifier $A_1$. The output signal produced by amplifier $A_4$ has the same amplitude but an inverse phase of the thermal noise contribution from switch S6. This matched signal with an inverted gain cancels the thermal noise caused by the switch S6.

The effect of this is that thermal noise $V_{N1}$ generated by switches S1 and S6 are effectively canceled by amplifiers $A_2$ and $A_4$, thereby significantly reducing thermal noise in circuit 200. As a result, the size of capacitor $C_{S1}$ can be reduced, which reduces the area needed in an integrated circuit to implement the capacitor and reduces power consumption by amplifiers driving the capacitor.

Furthermore, the non-inverting and inverting inputs of amplifier $A_2$ are differentially coupled to switch S1. Thus, amplifier $A_2$ only amplifies the thermal noise caused by switch S1 but does not affect the input signal $V_{IN}$.

Figure 5:
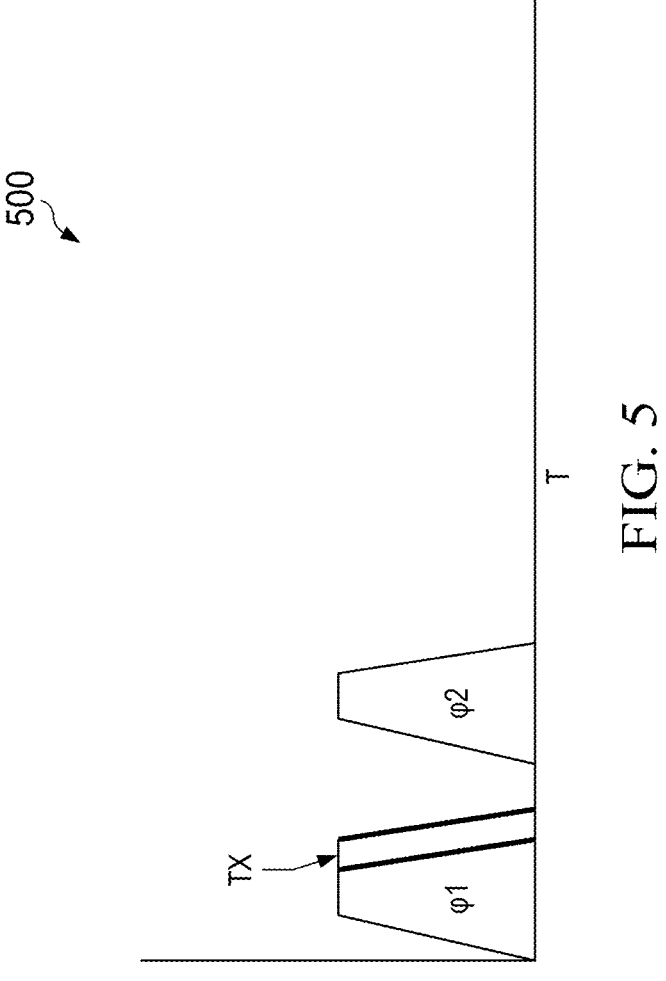
FIG. 5 shows a timing of operation of switches of the circuit of FIG. 2.

FIG. 5 shows timing 500 of the operation of switches S1, S2, S3, S4, S5 and S6. In the first phase ($\varphi 1$), switches S1, S3, S4, and S6 are turned ON (close) and switches S2 and S5 are turned OFF (i.e., open). In the second phase ($\varphi 2$)), switches S1, S4, and S6 are turned OFF (open) and switches S2 and S5 are turned ON (close). In this phase, amplifiers $A_1$ and $A_2$ operate in a closed loop configuration, and the charge on capacitor $C_{S1}$ is transferred to capacitor $C_F$, and as a result output voltage $V_{OUT}$ appears at circuit output 204. As explained before, switches S1 and S6 are held ON (e.g., close) for an additional period TX. During this period, capacitor $C_{S2}$ is charged by noise signals from switches S1 and S6 charge CS2. This noise is cancelled due to operations by amplifier $A_2$ and $A_4$ during the period TX. Existing circuits and methods have drawbacks because the noise signal which charges capacitor $C_{S2}$ during the period TX is not cancelled. The illustrative embodiments significantly reduce thermal noise by utilizing amplifiers $A_2$ and $A_3$.

Figure 6:
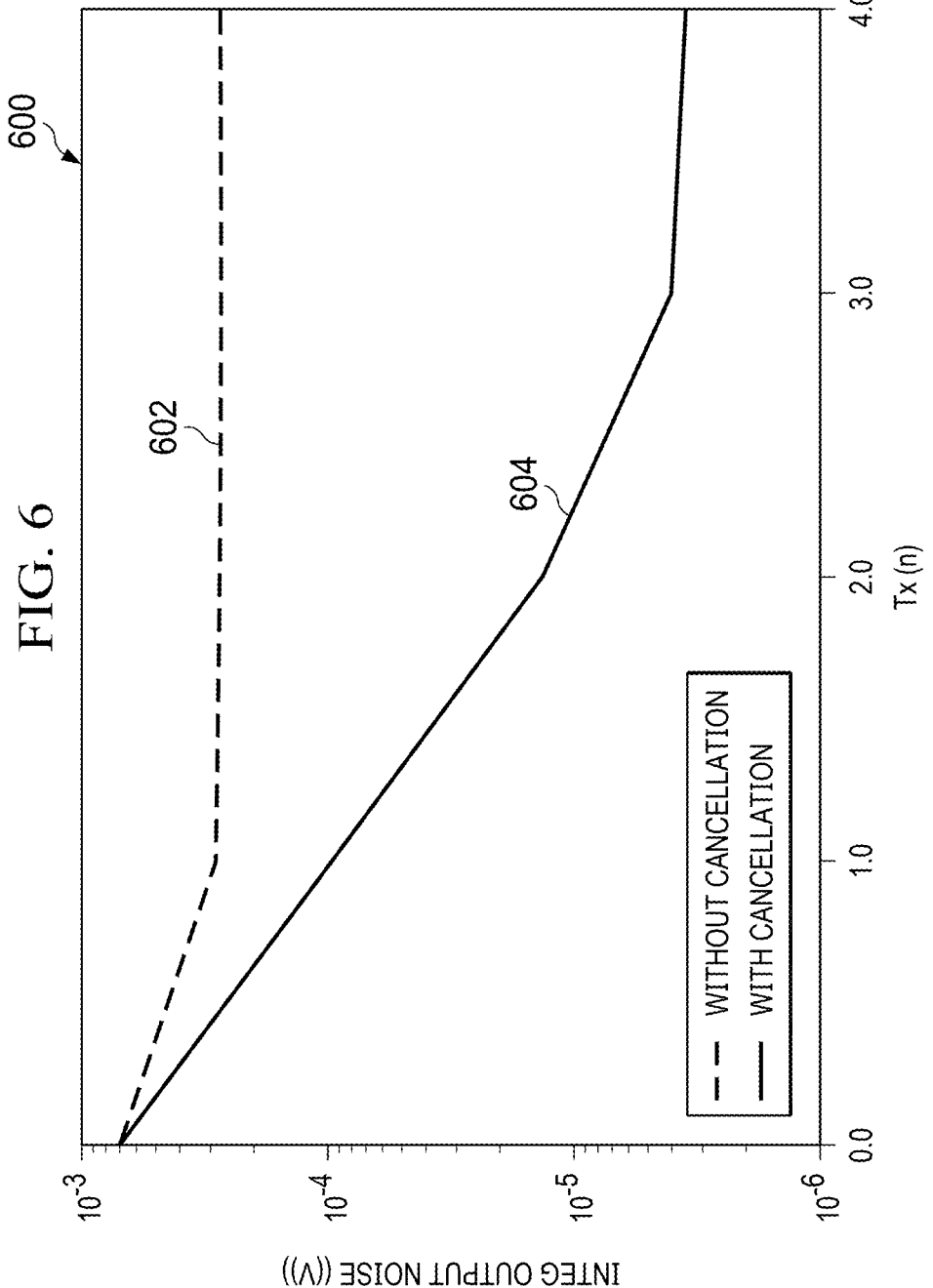
FIG. 6 illustrates a graph of output noise power vs. delay time.

FIG. 6 illustrates graphs 600 including graph 602 of output noise (V) vs. delay (TX) without noise cancellation and graph 604 of output noise (V) vs. delay (TX) when noise cancellation is implemented. Delay TX is an additional period during which switch S3 remains ON to allow amplifier outputs to settle. As shown in graph 602, at TX=3 ns, output noise is around 200 mV in a circuit without noise cancellation. In comparison, as shown in graph 604, at TX=3 ns, output noise is reduced to less than 3 mV in circuit 200. Thus, by implementing circuit 200, output noise is significantly reduced The circuits described herein may include one or more semiconductor elements (such as transistors), one or more passive elements (such as resistors, capacitors and/or inductors), and/or one or more sources (such as voltage and/or current sources). The circuits may include only semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party. While some example embodiments may include certain elements implemented in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Any transistors used in any of the circuits disclosed herein may be of any suitable type. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value, or, if the value is zero, a reasonable range of values around zero.

What is claimed is:

1. A switched-capacitor circuit, comprising:
a circuit input;
a circuit output;
a sample and hold stage including an input coupled to the circuit input and including an output;
an amplification stage including an input coupled to the output of the sample and hold stage and including an output;
an output stage including an input coupled to the output of the amplification stage and an output coupled to the circuit output;

a feedback stage including a first terminal coupled to the circuit output, a second terminal coupled to the input of the amplification stage, and including a third terminal;

a first noise cancellation stage having differential inputs coupled to the sample and hold stage and an output coupled to the output of the amplification stage; and a second noise cancellation stage including a first terminal coupled to the third terminal of the feedback stage and a second terminal coupled to the output of the amplification stage, wherein the sample and hold stage comprises:

a first switch including a first terminal coupled to the circuit input and including a second terminal;

a second switch including a first terminal coupled to the second terminal of the first switch and a second terminal coupled to a reference potential;

a first sampling capacitor including a first terminal coupled to the second terminal of the first switch and including a second terminal; and a third switch including a first terminal coupled to the second terminal of the first sampling capacitor and a second terminal coupled to the reference potential.

2. The switched-capacitor circuit of claim 1, wherein the amplification stage comprises:

a first operational amplifier including a non-inverting input coupled to the second terminal of the first sampling capacitor, an inverting input coupled to the reference potential and including an output;

a second sampling capacitor including a first terminal coupled to the output of the first operational amplifier and including an output; and a fourth switch including a first terminal coupled to the second terminal of the second sampling capacitor and a second terminal coupled to the reference potential.

3. The switched-capacitor circuit of claim 2, wherein the first noise cancellation stage comprises a second operational amplifier including a non-inverting input coupled to the first terminal of the first switch, an inverting input coupled to the second terminal of the first switch, and an output coupled to the output of the first operational amplifier.

4. The switched-capacitor circuit of claim 3, wherein the feedback stage comprises:

a feedback capacitor including a first terminal coupled to the non-inverting input of the first operational amplifier and including a second terminal;

a fifth switch including a first terminal coupled to the circuit output and a second terminal coupled to the second terminal of the feedback capacitor; and a sixth switch including a first terminal coupled to the second terminal of the feedback capacitor and a second terminal coupled to the reference potential.

5. The switched-capacitor circuit of claim 4, wherein the output stage comprises a third operational amplifier including an inverting input coupled to the second terminal of the second sampling capacitor, a non-inverting input coupled to the reference potential and an output coupled to the circuit output.

6. The switched-capacitor circuit of claim 4, wherein the second noise cancellation stage comprises a fourth operational amplifier including a non-inverting input coupled to the second terminal of the feedback capacitor, an inverting input coupled to the reference potential and an output coupled to the output of the first operational amplifier.

7. The switched-capacitor circuit of claim 6, wherein during a first phase, the switched-capacitor circuit is configured to:

close the first, third, fourth and sixth switches; and open the second and fifth switches, and wherein the first sampling capacitor is coupled to the circuit input, and the feedback circuit is disconnected from the first and third operational amplifiers.

8. The switched-capacitor circuit of claim 5, wherein during a second phase, the switched-capacitor circuit is configured to:

open the first, third, fourth and sixth switches; and close the second and fifth switches, and wherein the feedback circuit is connected to the first and third operational amplifiers, and the first sampling capacitor is disconnected from the circuit input.

9. The switched-capacitor circuit of claim 1, wherein the circuit input is configured to receive an input signal.

10. A switched-capacitor circuit comprising:

a circuit input;

a circuit output;

a first switch including a first terminal coupled to the circuit input and including a second terminal;

a second switch including a first terminal coupled to the second terminal of the first switch and including a second terminal coupled to a reference potential;

a first sampling capacitor including a first terminal coupled to the second terminal of the first switch and including a second terminal;

a third switch including a first terminal coupled to the second terminal of the sampling capacitor and a second terminal coupled to the reference potential;

a first operational amplifier including a non-inverting input coupled to the second terminal of the first sampling capacitor, an inverting input coupled to the reference potential and including an output;

a second sampling capacitor including a first terminal coupled to the output of the first operational amplifier and including an output;

a fourth switch including a first terminal coupled to the second terminal of the second sampling capacitor and a second terminal coupled to the reference potential;

a second operational amplifier including a non-inverting input coupled to the first terminal of the first switch, an inverting input coupled to the second terminal of the first switch, and an output coupled to the output of the first operational amplifier;

a third operational amplifier including an inverting input coupled to the second terminal of the second sampling capacitor, a non-inverting input coupled to the reference potential and an output coupled to the circuit output; and a feedback circuit including a first terminal coupled the circuit output and a second terminal coupled to the non-inverting input of the first operational amplifier.

11. The switched-capacitor circuit of claim 10, comprising a second noise cancellation stage including a fourth operational amplifier including a non-inverting input coupled to the second terminal of a feedback capacitor, an inverting input coupled to the reference potential and an output coupled to the output of the first operational amplifier.

12. The switched-capacitor circuit of claim 10, wherein the feedback circuit comprises:

a feedback capacitor including a first terminal coupled to the non-inverting input of the first operational amplifier and including a second terminal;

a fifth switch including a first terminal coupled to the circuit output and a second terminal coupled to the second terminal of the feedback capacitor; and a sixth switch including a first terminal coupled to the second terminal of the feedback capacitor and a second terminal coupled to the reference potential.

13. The switched-capacitor circuit of claim 12, wherein during a first phase, the switched-capacitor circuit is configured to:

close the first, third, fourth and sixth switches; and open the second and fifth switches, and wherein the first sampling capacitor is coupled to the circuit input, and the feedback circuit is disconnected from the first and third operational amplifiers.

14. The switched-capacitor circuit of claim 12, wherein during a second phase, the switched-capacitor circuit is configured to:

open the first, third, fourth and sixth switches; and close the second and fifth switches, and wherein the feedback circuit is connected to the first and third operational amplifiers, and the first sampling capacitor is de-coupled from the circuit input.

15. A switched-capacitor circuit comprising:

a circuit input;

a circuit output;

a first switch including a first terminal coupled to the circuit input and including a second terminal;

a second switch including a first terminal coupled to the second terminal of the first switch and including a second terminal coupled to a reference potential;

a first sampling capacitor including a first terminal coupled to the second terminal of the first switch and including a second terminal;

a third switch including a first terminal coupled to the second terminal of the sampling capacitor and a second terminal coupled to the reference potential;

a first operational amplifier including a non-inverting input coupled to the second terminal of the first sampling capacitor, an inverting input coupled to the reference potential and including an output;

a second sampling capacitor including a first terminal coupled to the output of the first operational amplifier and including an output;

a fourth switch including a first terminal coupled to the second terminal of the second sampling capacitor and a second terminal coupled to the reference potential;

a second operational amplifier including a non-inverting input coupled to the first terminal of the first switch, an inverting input coupled to the second terminal of the first switch, and an output coupled to the output of the first operational amplifier;

a third operational amplifier including an inverting input coupled to the second terminal of the second sampling capacitor, a non-inverting input coupled to the reference potential and an output coupled to the circuit output; and a fourth operational amplifier including a non-inverting input coupled to the second terminal of a feedback capacitor, an inverting input coupled to the reference potential and an output coupled to the output of the first operational amplifier.

16. The switched-capacitor circuit of claim 15, further comprising:

the feedback capacitor including a first terminal coupled to the non-inverting input of the first operational amplifier and including a second terminal;

a fifth switch including a first terminal coupled to the circuit output and a second terminal coupled to the second terminal of the feedback capacitor; and a sixth switch including a first terminal coupled to the second terminal of the feedback capacitor and a second terminal coupled to the reference potential.

17. The switched-capacitor circuit of claim 15, wherein during a first phase, the switched-capacitor circuit is configured to:

close the first, third, fourth and sixth switches; and open the second and fifth switches, and wherein the first sampling capacitor is coupled to the circuit input, and the feedback circuit is disconnected from the first and third operational amplifiers.

18. The switched-capacitor circuit of claim 15, wherein during a second phase, the switched-capacitor circuit is configured to:

open the first, third, fourth and sixth switches; and close the second and fifth switches, and wherein the feedback circuit is connected to the first and third operational amplifiers, and the first sampling capacitor is de-coupled from the circuit input.

19. The switched-capacitor circuit of claim 15, wherein the circuit input is configured to receive an input signal.

20. A switched-capacitor circuit, comprising:

a circuit input;

a circuit output;

a sample and hold stage including an input coupled to the circuit input and including an output;

an amplification stage including an input coupled to the output of the sample and hold stage and including an output;

an output stage including an input coupled to the output of the amplification stage and an output coupled to the circuit output;

a feedback stage including a first terminal coupled to the circuit output, a second terminal coupled to the input of the amplification stage, and including a third terminal;

a first noise cancellation stage having differential inputs coupled to the sample and hold stage and an output coupled to the output of the amplification stage; and a second noise cancellation stage including a first terminal coupled to the third terminal of the feedback stage and a second terminal coupled to the output of the amplification stage, wherein the sample and hold stage comprises:

a first switch including a first terminal coupled to the circuit input and including a second terminal;

a second switch including a first terminal coupled to the second terminal of the first switch and a second terminal coupled to a reference potential;

a first sampling capacitor including a first terminal coupled to the second terminal of the first switch and including a second terminal; and a third switch including a first terminal coupled to the second terminal of the first sampling capacitor and a second terminal coupled to the reference potential, and wherein the first noise cancellation stage comprises an operational amplifier including a non-inverting input coupled to the first terminal of the first switch, an inverting input coupled to the second terminal of the first switch, and an output coupled to the output of the amplification stage, and wherein the operational amplifier is configured to receive a differential input signal from the first switch.

21. The switched-capacitor circuit of claim 20, wherein the feedback stage is activated in a transfer phase, thereby producing an output voltage at the circuit output.

* * * * *